United States Patent [19]

Benhamida

[11] Patent Number: 5,315,184
[45] Date of Patent: May 24, 1994

[54] SELF ARBITRATING AUTO RESETTABLE FLAG CIRCUIT

[75] Inventor: Boubekeur Benhamida, Boise, Id.

[73] Assignee: Zilog, Inc., Campbell, Calif.

[21] Appl. No.: 878,201

[22] Filed: May 4, 1992

[51] Int. Cl.$^5$ ............................................. H03K 5/26
[52] U.S. Cl. ................................. 307/518; 307/272.2
[58] Field of Search .................... 307/272.3, 480, 514, 307/518, 272.1, 272.2; 328/109

[56] References Cited

U.S. PATENT DOCUMENTS

| | | | |
|---|---|---|---|
| 4,620,118 | 10/1986 | Barber | 307/514 |
| 4,968,906 | 11/1990 | Pham et al. | 307/480 |
| 4,980,577 | 12/1990 | Baxter | 307/518 |
| 5,038,059 | 8/1991 | Ebzery et al. | 307/518 |
| 5,047,658 | 9/1991 | Shrock et al. | 307/480 |

OTHER PUBLICATIONS

"Digital Troubleshooting" by Richard Gasperini, pp. 9-2, 9-3, 1976, published by Movonics Company, Los Altos, Calif.

*Primary Examiner*—Timothy P. Callahan
*Assistant Examiner*—Shawn Riley
*Attorney, Agent, or Firm*—Majestic, Parsons, Siebert & Hsue

[57] ABSTRACT

A flag setting, reading and clearing circuit is described which includes self arbitrating logic to provide priority for the flag setting portion of the circuit over the flag clearing portion. The flag is set by a set flag signal generated by a portion of a computer system to which the flag setting, reading and clearing circuit is a part. The set flag signal sets the flag by latching the voltage level of a voltage supply to a node in the circuit. A read status signal then latches the voltage at the node to another location which other portions of the computer system can access. At the same time, the read status signal clears the voltage level at the node unless the self arbitrating logic prevents it from doing so. The self arbitrating logic prevents the clearing portion of the circuit from clearing the flag when the set flag signal and the read status signal are both activated or HIGH at the same time. It does this by effectively canceling a control signal to the clearing portion of the circuit which is activated by the read status signal.

20 Claims, 4 Drawing Sheets

SELF ARBITRATING AUTO RESETTABLE FLAG CIRCUIT

BACKGROUND OF THE INVENTION

This invention relates in general to flag setting and reading circuits and in particular, to a self arbitrating and automatically resettable flag setting and reading circuit.

A flag or status bit signal is initiated by one part of a computer system so that another part of the computer system can be made aware of the existence or nonexistence of a condition and accordingly, take appropriate action. For example, when a microprocessor unit tries to write to an already full buffer, a buffer controller initiates a flag setting signal which is transmitted to a flag setting and reading circuit to indicate an overrun condition. The flag setting and reading circuit then sets a flag in its circuitry. To check the status of the buffer, the microprocessor initiates a flag reading signal which is transmitted to the flag setting and reading circuit. The flag setting and reading circuit then latches the previously set flag into a location accessible to the microprocessor. The microprocessor then reads the flag from the location, is made aware of the overrun condition, and stops attempting to write to the buffer until the buffer clears.

OBJECTS AND SUMMARY OF THE INVENTION

It is often desirable to include within the circuitry which reads or checks the flag or status bit, additional circuitry which automatically resets or clears the flag or status bit simultaneously with or immediately after the reading or checking of the flag or status bit.

Problems can arise, however, if another part of the computer system is trying to set the flag or status bit at the same or substantially the same time that the flag or status bit reading or checking circuitry is attempting to reset or clear the flag or status bit. To avoid these problems, some means of arbitrating between the flag setting and the flag clearing mechanisms must be provided.

Accordingly, a first object of the present invention is to automatically reset or clear the flag or status bit simultaneously with or immediately after the reading or checking of the flag or status bit.

In conjunction with the first object, another object is to provide means for arbitrating between a flag setting mechanism and the flag clearing mechanism of the first object, where the two mechanisms occur asynchronously and at the same or substantially the same time.

These and additional objects are accomplished by the various aspects of the present invention. One aspect of the present invention is a circuit for clearing the flag or status bit automatically in conjunction with the reading or checking of the flag or status bit. The clearing circuit comprises among other things, means responsive to a read status signal for clearing the flag or status bit. Depending upon the type of latching circuitry for the flag or status bit, the clearing means can include a reset input to a latch or a transistor switch which resets or clears the flag or status bit.

Within the clearing means is generated a control signal which depending upon the type of latching circuitry for the flag or status bit, drives either the reset input to a latch or the gate input to a transistor switch. When clearing of the flag or status bit is desired, pulse generation of the control signal is accomplished by logic means comprising among other things, means for inverting the read status signal and then delaying the inverted signal by a predetermined amount of time, and means for logically ANDing the read status signal with its thus inverted and delayed version to generate the control signal.

The control signal thus generated takes the form of a pulse with pulse width equal to the predetermined delay time. At the starting edge of the pulse, depending upon the type of latching circuitry for the flag or status bit, a latch will be reset or a shorting transistor will be switched ON and accordingly, the flag or status bit will be reset or cleared. At the ending edge of the pulse, the reset input to the latch or the shorting transistor will be switched OFF and accordingly, a subsequent flag or status bit can be set without the flag or status bit being immediately reset or cleared before a subsequent read status signal can be initiated.

Another aspect of the present invention is the inclusion of a self arbitrating circuit within the clearing circuitry. The self arbitrating circuit arbitrates between a set flag signal and a read status signal by giving the set flag signal priority if both signals go active concurrently. It does this through logic that effectively cancels the normal control signal to clear the flag or status bit.

The self arbitrating circuitry comprises among other things, a pair of transistors connected in series. The source of one of the transistors is connected to the previously described inverted and delayed version of the read status signal which was generated as an intermediate signal for generating the control signal of the clearing circuit. The drain of the other transistor is connected to an electrical ground. The gate of one transistor is then connected to the set flag signal and the gate of the other transistor is connected to the read status signal. Consequently, if both the set flag signal and the read status signal are active concurrently, pulse cancellation of the control signal occurs by first shorting the inverted and delayed version of the read status signal to ground, then logically ANDing the shorted signal with the read status signal to generate the pulse cancelled control signal. As a result of thus cancelling the control signal, the flag or status bit will not be cleared or reset.

Another aspect of the present invention is the combination of the flag clearing and self arbitrating circuitry with a flag setting and reading circuit. The flag setting portion of the circuit latches a predetermined value into a flag location when the set flag signal is initiated by a different portion of the computer system. The flag reading portion of the circuit latches the predetermined value stored in the flag location to another location which is accessible to other parts of the computer system when the read status signal is initiated by another portion of the computer system. Simultaneously with the activation of the reading portion of the circuit, the clearing and self arbitrating portions of the circuit control the clearing or resetting of the value stored in the flag location depending upon whether the set flag signal and the read status signal occur concurrently or not.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
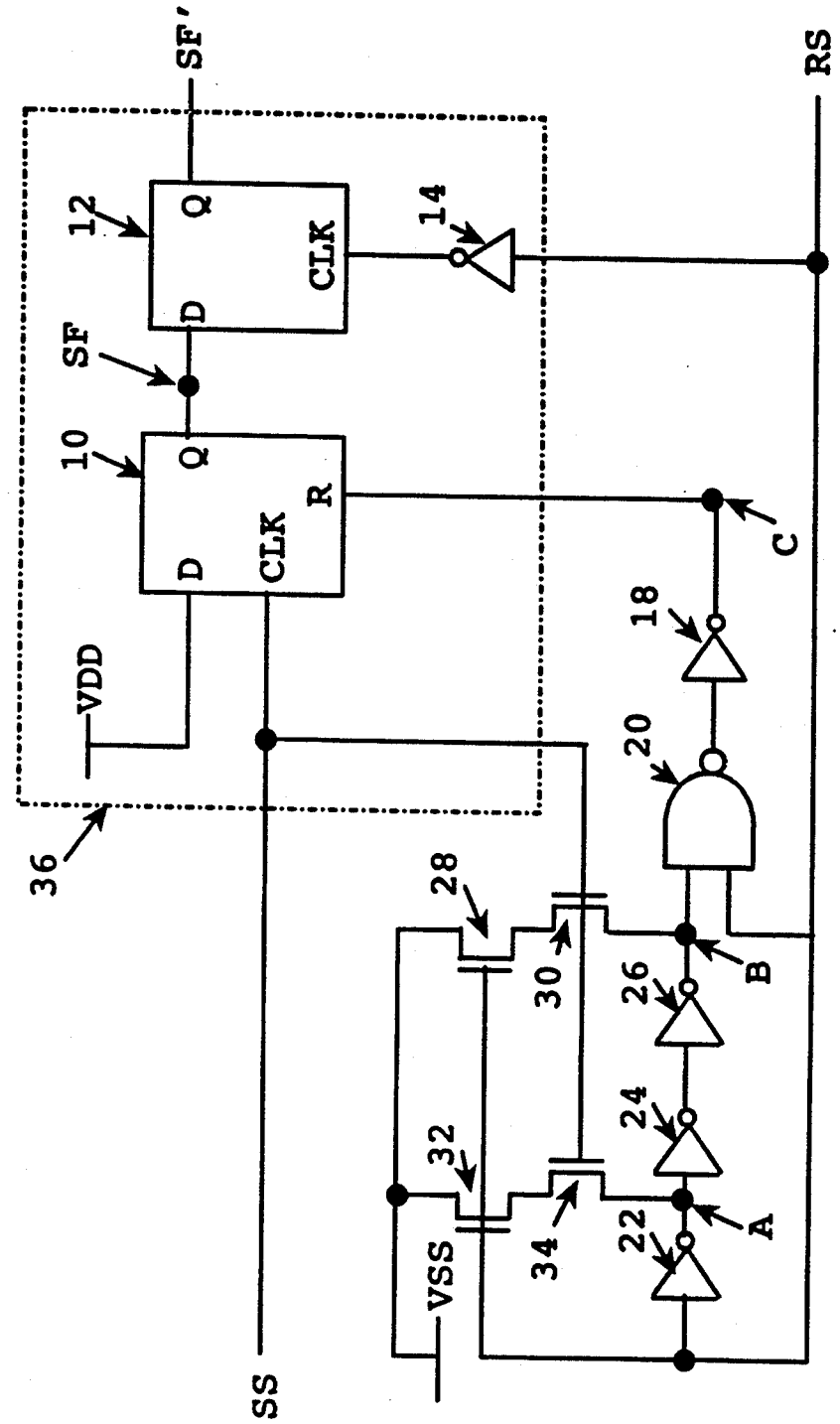
FIG 1 illustrates, as an example, a flag setting, reading and clearing circuit utilizing aspects of the present invention.

FIG. 1 illustrates, a circuit utilizing aspects of the present invention for setting, reading and clearing a flag or status bit. In a setting portion of the circuit, a voltage supply VDD is connected to a D-input and a set flag signal SS is connected to a clock input CLK of a resettable D-latch 10. When it is desired to set a flag or status bit at node SF, a single pulse is generated on the set flag signal SS by another part of the computer system (not shown). As a result of the pulse, the voltage level of the voltage supply VDD is latched onto a Q-output of the resettable D-latch 10. Thereafter, node SF which is connected to the Q-output of the resettable D-latch 10, will be at a HIGH state until the resettable D-latch 10 is reset.

When it is subsequently desired to read or check the flag or status bit previously set at node SF, a read status signal RS is initiated by another part of the computer system (not shown). In a reading portion of the circuit, the node SF is connected to a D-input of a D-latch 12, and the read status signal RS is connected to an input of inverter 14 whose output is connected to a clock input CLK of the D-latch 12. Consequently, while the read status signal RS remains LOW, the D-latch 12 is transparent and the flag or status bit at node SF generates the latched flag signal SF'. On the other hand, when the read status signal RS goes HIGH, the flag signal SF' is latched into D-latch 12 and does not change state even if node SF is subsequently reset or cleared. The latched flag signal SF' which is generated at the Q-output of the D-latch 12, can then be read by another part of the computer system (not shown).

The read status signal RS also automatically clears the flag or status bit at node SF unless the self arbitrating circuitry of the circuit prevents it from doing so. The self arbitrating circuitry generates a control signal at node C which is connected to the reset input R of the resettable D-latch 10. In a clearing portion of the circuit, when the control signal at node C is HIGH, the resettable D-latch 10 resets its Q-output to a LOW state. On the other hand, when the control signal at node C is LOW, the resettable D-latch 10 and the flag or status bit generated at its Q-output is not reset.

In a control signal generating portion of the circuit, three inverters 22, 24 and 26 are connected in series with the read status signal RS connected to an input of inverter 22. Normally, the output of inverter 26 is an inverted and delayed version of the read status signal RS, where the delay is equal to the time required to transmit the signal through the three inverters 22, 24 and 26. By connecting the output of inverter 26 to one input of NAND gate 20 and the read status signal RS to a second input of NAND gate 20 and then inverting the output of NAND gate 20 by connecting it to the input of inverter 18, the output of inverter 18 generates a control signal at node C which takes the form of a pulse with pulse width equal to the delay through the inverters 22, 24 and 26. The rising edge of the pulse thus generated at node C then acts to reset the resettable D-latch 10 as previously described.

Figure 3:
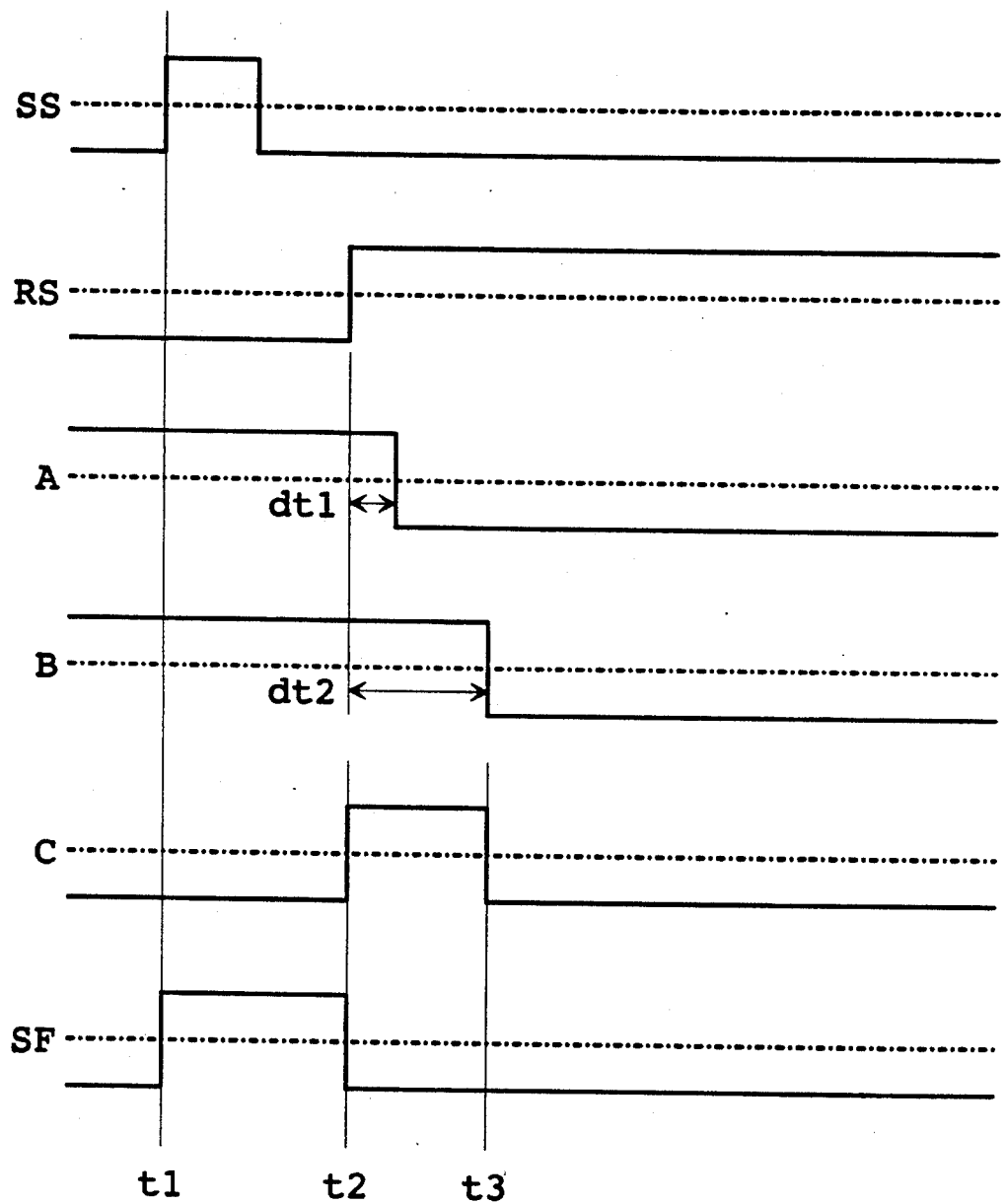
FIG. 3 illustrates timing diagrams representative of corresponding or equivalent signals in FIGS. 1 and 2, where a read status signal (RS) is initiated after completion of a set flag signal (SS)

FIG. 3 further serves to clarify the operation of the clearing portion of the circuit. The set flag signal SS is shown to initiate a pulse at time t1 which acts to set the flag or status bit at node SF. Subsequently, a read status signal RS is initiated at time t2. The inverter 22 then receives the read status signal RS and generates at its output a signal A which is not only an inverted version of the read status signal RS, but also a delayed version of the signal by a time dt1, where dt1 is the switching delay time of the inverter 22. Likewise, inverters 24 and 26 receive the output of inverter 22 and generate at the output of inverter 26 a signal B which is a delayed version of the output signal generated from inverter 22. Signal B then represents an inverted version of the read status signal RS which is delayed by a time dt2, where dt2 is the total switching delay time of all three inverters 22, 24 and 26.

NAND gate 20 then receives the signal B and the read status signal RS at two of its inputs, and inverter 18 receives the output of NAND gate 20 and generates the signal C at its output. The signal C, which is the control signal to the clearing portion of the circuit, is shown as a pulse with pulse width equal to the total switching delay time dt2 through the three inverters 22, 24 and 26. At the rising edge of the pulse, the flag or status bit at node SF is cleared. This is shown in FIG. 3 by the signal SF being reset to LOW at time t2. At the falling edge of the pulse, the clearing portion of the circuit is once again deactivated so that a subsequently set flag or status bit will not be cleared before it can be read or checked by the initiation of another read status signal RS.

Referring back now to FIG. 1, a self arbitrating portion of the circuit arbitrates between a simultaneously active or HIGH set flag signal SS and active or HIGH read status signal RS by bypassing the normal clearing operation of the circuit described above. Bypassing is accomplished by transistor pairs 32 and 34, and 28 and 30, which provide shorting paths to ground VSS at nodes A and B when both transistors of each transistor pair are switched ON. Since the gates of transistors 34 and 30 are connected to the set flag signal SS and the gates of transistors 32 and 28 are connected to the read status signal RS, all four transistors switch ON and as a result, short both nodes A and B to ground VSS when both the set flag signal SS and the read status signal RS are simultaneously active or HIGH. With node B thus shorted to ground VSS and the read status signal HIGH, the output of NAND gate 20 is then HIGH, and the output of inverter 18 is LOW. Consequently, the reset input R of the resettable D-latch 10 is LOW and resetting of the resettable D-latch 10 and as a result, the flag or status bit at node SF, does not occur.

Figure 4:
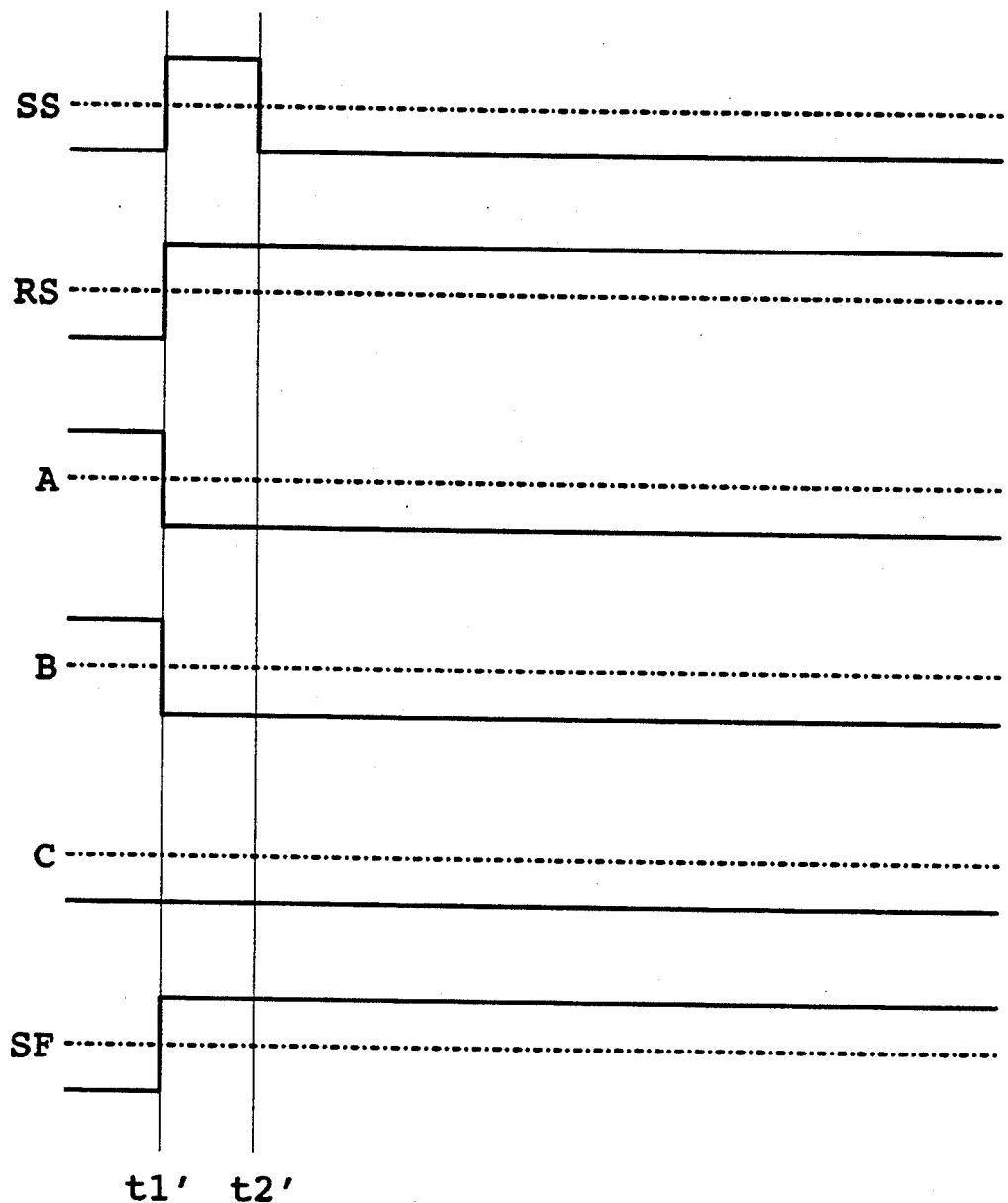
FIG. 4 illustrates timing diagrams representative of corresponding or equivalent signals in FIGS. 1 and 2, where a read status signal (RS) is initiated concurrently with a set flag signal (SS).

FIG. 4 further serves to clarify operation of the self arbitrating circuitry when the set flag signal SS and the read status signal RS go active or HIGH concurrently at time t1'. Since the set flag signal SS is HIGH at this time, transistors 34 and 30 switch ON. Likewise, since the read status signal RS is HIGH, transistors 32 and 28 switch ON. As a result, the voltage at both nodes A and B are pulled down to ground VSS. With the voltage at node B LOW and the read status signal HIGH, the output of NAND gate 20 is HIGH and the output of inverter 18 is LOW. Thus, the control signal at node C driving the reset input R of the resettable D-latch 10 is LOW and as a result, the flag or status bit at node SF is not reset or cleared.

At time t2', the set flag signal SS goes LOW. However, even though the read status signal RS is still active or HIGH, the flag or status bit at node SF does not reset or clear. In a subsequent action to clear or reset the flag or status bit at node SF, the read status signal must first go LOW and remain there sufficiently long enough to ensure that the voltage at node B goes HIGH. Once the voltage at node B is HIGH, a read status signal RS can then be activated by going HIGH, to read and clear the flag or status bit at node SF. This procedure ensures that the read portion of the circuit has time to latch the newly set flag or status bit at node SF through the D-latch 12 before the flag or status bit is cleared or reset by the resettable D-latch 10.

Figure 2:
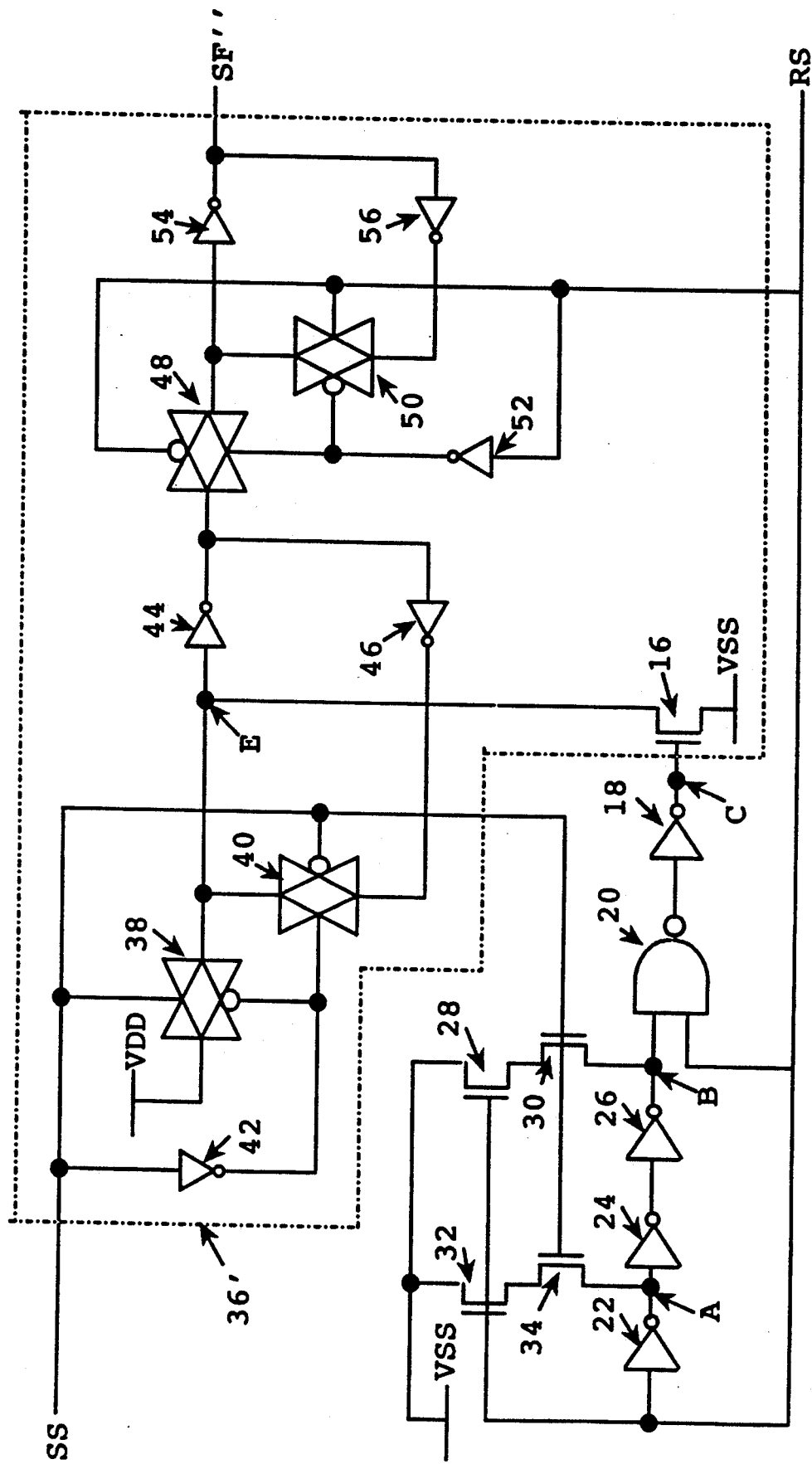
FIG. 2 illustrates a preferred embodiment of a flag setting, reading and clearing circuit utilizing aspects of the present invention.

FIG. 2 illustrates a preferred embodiment for the flag or status bit setting and latching portions of FIG. 1. The flag or status bit setting and latching portions shown in FIG. 1 as circuitry 36, have corresponding portions shown in FIG. 2 as circuitry 36'. D-latches were used in the previous discussion primarily to facilitate description of certain aspects of the present invention.

In the preferred embodiment of FIG. 2, the flag setting portion of the circuit comprises inverters 42, 44 and 46, and CMOS transmission gates 38 and 40. To set the flag or status bit at node E, the set flag signal SS goes HIGH which turns the transmission gate 38 ON and the transmission gate 40 OFF. Since the input to the transmission gate 38 is connected to a voltage supply VDD, when the transmission gate is turned ON node E goes HIGH.

In order to clear node E, the flag setting signal SS must first go LOW again. This turns the transmission gate 38 OFF and the transmission gate 40 ON. As a consequence, node E is no longer connected to the voltage source VDD. When the clearing portion of the circuit is then activated, the transistor 16 is switched ON and provides a discharge path to the ground VSS for node E.

The flag reading portion of the circuit comprises inverters 52, 54 and 56, and CMOS transmission gates 48 and 50. Subsequent to the setting of the flag or status bit at node E and prior to activation of the read status signal RS, the read status signal RS is LOW, the transmission gate 48 is ON and the transmission gate 50 is OFF. As a consequence, the output of inverter 44 whose input is the voltage at node E, is transmitted to inverter 54 whose output SF" is the latched flag signal which is available to be read by other portions of the computer system.

In this circuit, when the read status signal RS is then activated by going HIGH, the transmission gate 48 is turned OFF and the transmission gate 50 is turned ON. As a consequence, any subsequent resetting of the voltage at node E will not be transmitted to the latched flag signal SF" until the read status signal RS goes LOW again. By turning the transmission gate 50 ON, the voltage setting at the output of inverter 54 is maintained by the feedback path from the output of inverter 54 back to its input. The feedback path comprises inverter 56 whose input is the output of the inverter 54 and the turned ON transmission gate 50 whose input is the output of inverter 56 and whose output is fed back to the input of inverter 54.

Although the various aspects of the present invention have been described with respect to a preferred embodiment, it will be understood that the invention is entitled to full protection within the full scope of the appended claims.

What is claimed is:

1. A self arbitrating flag setting, reading, and clearing circuit comprising:
   a first means for receiving a plurality of inputs including a set flag signal and a read status signal, and generating a control signal in response thereof;
   a second means for receiving said control signal, and generating a reset signal in response thereof;
   a third means for receiving said set flag signal and said reset signal, and generating a latched output signal in response thereof; and
   a fourth means for receiving said latched output signal and said read status signal, and generating a latched flag signal in response thereof.

2. The self arbitrating flag setting, reading, and clearing circuit as recited in claim 1 wherein said first means comprises:
   means for receiving said read status signal and generating said control signal in the form of a pulse in response thereof; and
   means for receiving said read status signal and said set flag signal and cancelling said control signal pulse in response thereof, if said read status signal and said set flag signal are both active concurrently.

3. The self arbitrating flag setting, reading, and clearing circuit as recited in claim 2 wherein said control signal generating means comprises:
   means for receiving said read status signal and generating an output signal in response thereof by inverting said read status signal and delaying said inverted read status signal a predetermined period of time; and
   means for receiving said output signal and said read status signal, and generating said control signal in response thereof.

4. The self arbitrating flag setting, reading, and clearing circuit as recited in claim 3 wherein said control signal cancelling means comprises:
   means for shorting said output signal to ground if said read status signal is a first predetermined value at the same time that said set flag signal is a second predetermined value.

5. The self arbitrating flag setting, reading, and clearing circuit as recited in claim 3 wherein said inverting and delaying means comprises:
   a plurality of inverters connected in series wherein the number of inverters is an odd number and said first inverter of the series has an input for receiving said read status signal and said last inverter of the series has an output for generating said output signal.

6. The self arbitrating flag setting, reading, and clearing circuit as recited in claim 4 wherein said shorting means comprises:
   two transistors connected in series, each transistor having a source, a gate and a drain, wherein the gate of one transistor is connected to said set flag signal and the gate of the other transistor is connected to said read status signal, and the drain of one transistor is connected to electrical ground and the source of the other transistor is connected to said output signal.

7. The self arbitrating flag setting, reading, and clearing circuit as recited in claim 3 wherein said control signal generating means comprises:
   means for logically ANDing said output signal and said read status signal to generate said control signal in response thereof.

8. The self arbitrating flag setting, reading, and clearing circuit as recited in claim 7 wherein said logically ANDing means comprises:
   a NAND gate having a plurality of inputs and an output, one input being connected to said output signal and another input being connected to said read status signal; and
   an inverter having an input and an output, said input connected to the output of said NAND gate, and said output generating said control signal in response thereof.

9. The self arbitrating flag setting, reading, and clearing circuit as recited in claim 1 wherein said second means comprises:
   a transistor having a source, a gate and a drain, said drain being connected to an electrical ground, said gate being connected to said control signal, and said source providing said reset signal.

10. The self arbitrating flag setting, reading, and clearing circuit as recited in claim 1 wherein said third means comprises:
    a resettable latch having an input connected to a voltage source, a clock input connected to said set flag signal, a reset input connected to said reset signal, and an output providing said latched output signal.

11. The self arbitrating flag setting, reading, and clearing circuit as recited in claim 1 wherein said third means comprises:
    an inverter having an input and an output; and
    a CMOS transmission gate having an input connected to a voltage source, two control gates, and an output, wherein the input of said inverter and one of said two control gates are connected to said set flag signal, the other of said two control gates is connected to the output of said inverter, and said output of said CMOS transmission gate provides said latched output signal in response thereof.

12. The self arbitrating flag setting, reading, and clearing circuit as recited in claim 11 wherein said second means comprises:
    a transistor having a source, a gate and a drain, said drain being connected to an electrical ground, said gate being connected to said control signal, and said source being connected to said latched output signal and providing said reset signal.

13. The self arbitrating flag setting, reading and clearing circuit as recited in claim 1 wherein said fourth mean comprise:
    an inverter having an input and output, said read status signal being connected to said input; and
    a latch having an input connected to said latched output signal, a clock input connected to said output of said inverter, and an output providing said latched flag signal.

14. The self arbitrating flag setting, reading and clearing circuit as recited in claim 1 wherein said fourth means comprises:
    a first, second and third inverter, each inverter having an input and an output; and
    a CMOS transmission gate having an input connected to the output of said first inverter, two control gates, and an output connected to the input of said third inverter, wherein the input of said first inverter is connected to the latched output signal generated by the third means, one of the control gates is connected to the read status signal and the other control gate is connected to the output of said second inverter, the input of said second inverter is connected to the read status signal, and the output of said third inverter provides said latched flag signal.

15. A method for generating a control signal for clearing a preset status bit comprising the steps of:
    receiving a read status signal;
    inverting said read status signal;
    delaying said inverted read status signal a predetermined amount of time;
    receiving a set flag signal;
    logically ANDing said set flag signal and said read status signal to generate a shorting signal;
    shorting said inverted and delayed read status signal to an electrical ground if said shorting signal indicates that both said read status signal and said set flag signal are both active; and
    logically ANDing said inverted and delayed read status signal with said read status signal to generate said control signal in response thereof.

16. A method for setting, reading and clearing a status bit comprising the steps of:
    receiving a set flag signal;
    generating a status bit in response to said set flag signal;
    receiving a read status signal;
    latching said status bit into a storage device in response to said read status signal;
    inverting said read status signal;
    delaying said inverted read status signal a predetermined amount of time; and
    logically ANDing said inverted and delayed read status signal with said read status signal to generate a control signal in response thereof; and
    clearing said status bit when said control signal is a predetermined value.

17. The method as recited in claim 16, further comprising the steps of:
    logically ANDing said set flag signal and said read status signal to generate a shorting signal in response thereof; and
    shorting said inverted and delayed read status signal to an electrical ground if said shorting signal is a predetermined value.

18. A self arbitrating flag setting, reading, and clearing circuit comprising:
    a first flip-flop having a data input, a clock input, a reset input, and an output, wherein said data input is connected to a voltage supply, said clock input is connected to a set flag signal, and said output provides a status flag;
    a second flip-flop having a data input, a clock input, and an output, wherein said data input is connected to said output of said first flip-flop, said clock input is responsive to a read status signal, and said output provides a latched status flag; and
    a logic circuit having a first input connected to said set flag signal, a second input connected to said read status signal, and an output connected to said reset input of said first flip-flop, wherein said output causes said first flip-flop to be reset when said read status signal is active, unless said set flag signal is also active.

19. The self arbitrating flag setting, reading, and clearing circuit as recited in claim 18 wherein said logic circuit comprises:

a delay circuit having an input connected to said read status signal, and an output;

an inverter having an input connected to said output of said delay circuit, and an output; and a second logic circuit having a first input connected to said read status signal, a second input connected to said output of said inverter, and an output connected to said reset input of said first flip-flop.

20. The self arbitrating flag setting, reading, and clearing circuit as recited in claim 19 wherein said delay circuit further comprises:

a third logic circuit having a first input connected to said read status signal, a second input connected to said set flag signal, and an output resembling said read status signal delayed in time if said set flag signal is inactive, or resembling an inactive read status signal if said set flag signal is active.

* * * * *